United States Patent
Havemann et al.

[11] Patent Number: 6,159,847
[45] Date of Patent: Dec. 12, 2000

[54] MULTILAYER METAL STRUCTURE FOR IMPROVED INTERCONNECT RELIABILITY

[75] Inventors: Robert H. Havemann, Garland; Girish A. Dixit, Plano, both of Tex.

[73] Assignee: Texas Instruments Incorporated, Dallas, Tex.

[21] Appl. No.: 09/191,027

[22] Filed: Nov. 12, 1998

Related U.S. Application Data

[60] Provisional application No. 60/065,682, Nov. 18, 1997.

[51] Int. Cl.⁷ .................................................. H01L 21/44
[52] U.S. Cl. ............................................ 438/652; 438/652
[58] Field of Search ..................................... 438/687, 688, 438/652, 648, 650, 628, 644, 654, 907

[56] References Cited

U.S. PATENT DOCUMENTS

| | | | |
|---|---|---|---|
| 5,693,568 | 12/1997 | Liu et al. | 434/687 |
| 5,814,557 | 9/1998 | Venkatraman et al. | 438/622 |
| 5,880,023 | 3/1999 | Jun | 438/652 |
| 5,998,297 | 12/1999 | Brennan | 438/687 |

*Primary Examiner*—David Nelms
*Assistant Examiner*—Dung A Le
*Attorney, Agent, or Firm*—Jacqueline J. Garner; W. James Brady, III; Frederick J. Telecky, Jr.

[57] ABSTRACT

AlCu alloys with higher Cu content are added in thin layers within a metallization structure. The increased Cu content provided by the thin layer improves interconnect reliability and reduces the effects of electromigration with minimal effect on plasma etch and cleanup processes.

13 Claims, 4 Drawing Sheets

MULTILAYER METAL STRUCTURE FOR IMPROVED INTERCONNECT RELIABILITY

This application claims benefit to provisional application Ser. No. 60/065,682 filed Nov. 18, 1997.

BACKGROUND AND SUMMARY OF THE INVENTION

The present invention relates to integrated circuit structures and fabrication methods.

1. Background: Metallization

Aluminum has been the predominant metallization system in integrated circuit processes since the 1970s. However, pure aluminum metallization suffers from electromigration and/or spiking, and hence alloys are used rather than pure aluminum.

Electromigration is a phenomenon wherein, at high current densities, aluminum leads will develop necked-down portions or even voids. Unfortunately, these events usually take place after the chip has left the factory and is in operation in the field, causing a failure of the chip. Aluminum is normally alloyed with copper and/or titanium to reduce electromigration. However, copper is difficult to etch, and therefore the fraction of copper alloying is normally kept to about 1% or less. (Otherwise residues can be left behind after the etch process.) Higher concentrations of copper would be even more effective for reducing electromigration, if the etching problems could be solved.

Another important limitation on aluminum is that where pure aluminum directly contacts silicon, some of the silicon may be dissolved into the aluminum metallization when heating occurs. This can lead to the aluminum growing into the substrate to "spike" (create short-circuits through p/n junctions). Aluminum layers which must contact silicon are commonly alloyed with ½% to 1% of silicon to reduce junction spiking.

2. Background: Prior-Art Anti-Electromigration Techniques

Additional techniques for increasing the resistance to electromigration failure of an interconnect process include the following:

Using layered Al film structure, with a highly electromigration resistant metal (such as Ti, W, or Mo) as the central layer of a tri-layer film.

planarizing the intermetal dielectric, to eliminate thinning of the conductor lines as they cross steps.

selectively depositing a layer of CVD W over the Al lines.

avoiding the use of AlSi when fabricating narrow, multilevel-metal structures.

replacing the Al metallization with a more electromigration-resistant metal, such as W or Mo.

Metallization processes in multi-level interconnect applications involving aluminum alloys are further discussed in, for example, U.S. application Ser. No. 60/044,523 filed Apr. 22, 1997 (attorney's docket no. TI-23021) and Ser. No. 60/037,123 filed Feb. 3, 1997 (attorney's docket no. TI-23072), both of which are copending and commonly owned with the present application, and are hereby incorporated by reference.

Application TI-23021 suggests, among other embodiments, an embodiment in which the use of two stages of metal deposition permits the creation of differing aluminum alloy compositions in the contact or via hole and on the surface of the dielectric. Preferably, the aluminum alloy in the contact has a higher percentage of silicon (or germanium) and of copper than the aluminum on the surface.

Application TI-23072 suggests, among other embodiments, an embodiment in which copper is used as a wetting layer (for hole filling) in an aluminum damascene process. The local introduction of copper near the contact provides the best electromigration resistance at the locations of the highest current density.

Additional Definitions and Background

"Joule heating" refers to the dissipation of power when a current I is flowed through a resistance of value R. For DC current, the power dissipated is I squared times R. In analyzing thin film metallization, the resistance can be expressed as a resistance per unit length, and this formula can then be used to derive the power dissipated per unit length. The relevance of electromigration to joule heating is that, when a particular section of a thin film metallization line begins to become thinner in service, the localized heating in this particular thinned down section of the metal line will increase. This increases the diffusion rate of the metal atoms. This in turn accelerates the electromigration process.

"Current crowding" refers to the nonuniformity of current distribution in a solid conductor. For example, when a thin film metallization line has a neck down portion in it, the density of current (per unit cross sectional area) will increase at that location. This means that there is a higher flow of carriers per unit cross sectional area, and this higher density of carrier flow will itself accelerate the electromigration phenomenon.

Additional background on electromigration and other thin film metallization issues can be found in G. Rao, Multilevel Interconnect Technology (1993); and in the three volume series by Wolf, Silicon Processing for the VLSI Era (1986).

Innovative Improved Interconnect Reliability Methods

This application discloses introducing a higher concentration of a hard-to-etch alloying agent (such as Cu in Al) in thin layers which are adjacent thicker layers having a lower concentration of the alloying agent. The use of layering improves interconnect reliability with minimal disruption of the metal etch process.

A thin, heavily alloyed layer combined with a thicker, less heavily alloyed layer presents less of a problem during etch than a single homogeneous layer, yet the advantages of the homogeneous layer can be achieved by subsequent thermal cycling and/or final sinter, if desired.

Higher doping concentrations can be achieved using the disclosed technique, and layers with higher doping concentrations can be strategically located. For example, they can be placed at both top and bottom interfaces, to greatly impede electromigration, or at critical interfaces where joule heating and current crowding are more severe and may lead to metal diffusion.

Advantages of the disclosed invention includes:

metallization has reduced susceptibility to electromigration;

simple fabrication process;

easier to etch than large homogenous layer;

distribution of alloy can be adjusted by anneal;

allows use of higher concentrations of alloy.

BRIEF DESCRIPTION OF THE DRAWINGS

The disclosed inventions will be described with reference to the accompanying drawings, which show important sample embodiments of the invention and which are incorporated in the specification hereof reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview

Figure 1:
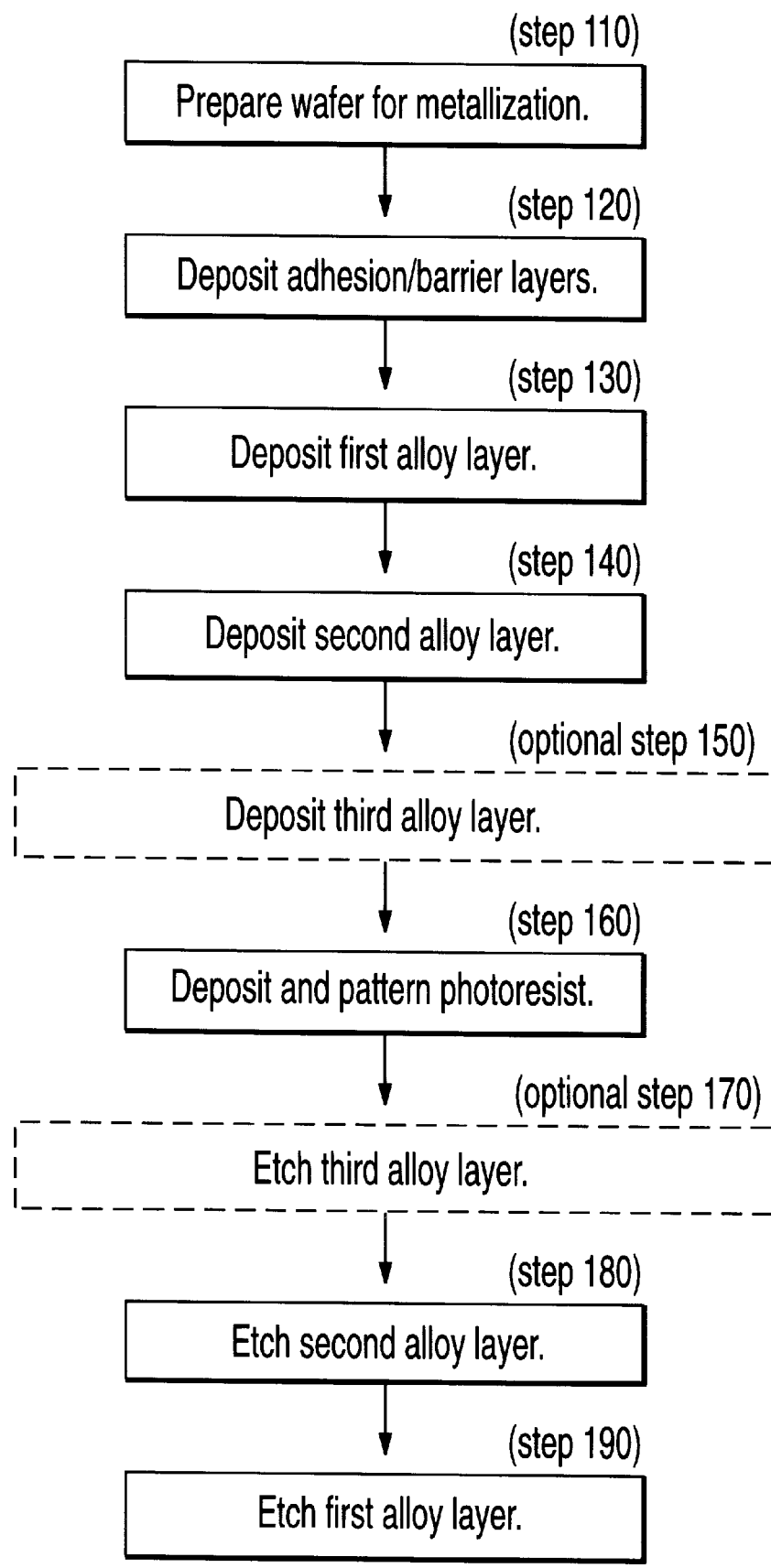
FIG. 1 shows a flowchart of the metallization process utilizing the preferred embodiment.

FIG. 1 shows a flowchart of a two- or three-layer fabrication process utilizing the disclosed method. In step 110, the wafer is prepared for the metallization process. This will typically include the formation of isolation structures, deposition and patterning of a gate stack, doping of active areas, and deposition of a dielectric. Prior to deposition of the main metallization layer, adhesion and/or barrier layers will typically by deposited, as shown in step 120.

A first metallization layer having a first alloy concentration is then deposited in step 130. A second metallization layer having a different alloy concentration is deposited in step 140, followed optionally in step 150, by a third metallization layer having a third alloy concentration.

Due to the differences in alloy concentrations, different strategies will typically be necessary to etch the individual metallization layers, with the thin, harder-to-etch layer(s) requiring, for example, a high-bias-power etch, while the thicker, easier-to-etch layers use normal metal etch conditions. In step 160, a photoresist is deposited and patterned. Optional step 170 is the etch of the third alloy layer, using the appropriate etch scheme. This is followed by the etch of the second alloy layer in step 180 and of the first layer in step 190, using respectively appropriate etches.

Figure 5:
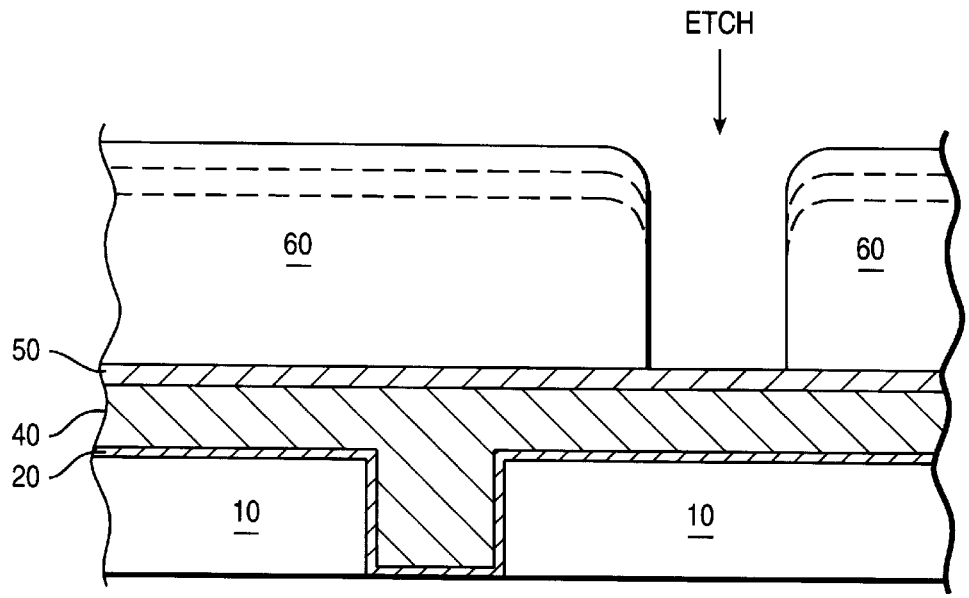
FIG. 5 shows the effect of etching on the metallization structure.

FIG. 5 is helpful in showing one of the advantages of the disclosed method. This figure shows the effect of etching on a two-layer metallization structure. The high-copper alloy, which is layer 50, is more difficult to etch and requires a high-power etch. The high-power etching rounds off the photoresist layer 60 top and sidewall surfaces as well as the metal alloy, as shown by the dotted line in this drawing. If this high-power etch were to be continued for a longer time, i.e. to etch through a thick layer of the high-copper alloy, the photoresist can be destroyed to the extent that the contact hole is widened and planned geometries destroyed. However, when this type etch is only used for very thin layers, the effect can be kept to manageable levels.

First Embodiment: Al/Cu Alloys in 4/1/4% Layers

Figure 2A:
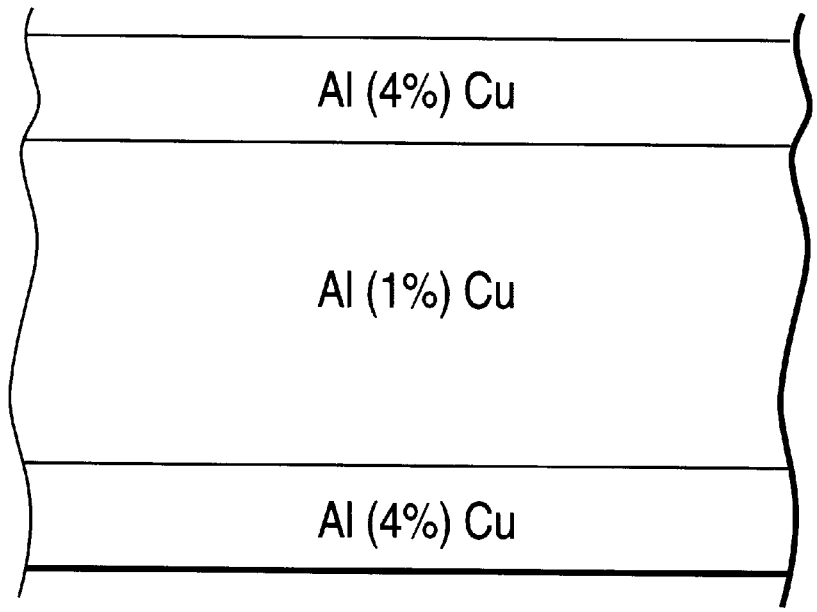
FIG. 2A shows a thick, low-copper aluminum alloy layer sandwiched between thin, high-copper aluminum alloy layers.

FIG. 2A shows a thick, 1% Cu/Al alloy layer sandwiched between thin, 4% Cu/Al alloy layers. In this example, the low-copper layer has a thickness of approximately 200 nm, while the high-copper layers can be thinner, e.g. a 20 nm thick bottom layer with a 50 nm thick top layer. During the etch procedures, short, high-bias-power etch steps are used on the top and bottom layers, with standard etch procedures for the thick middle layer.

Figure 4:
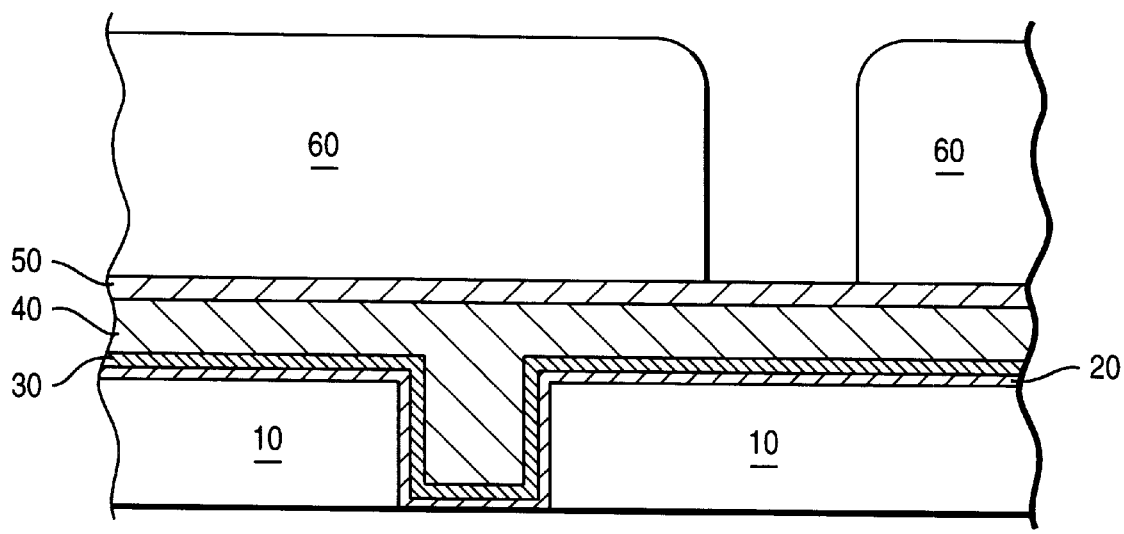
FIG. 4 shows a 3-layer Al/Cu alloy metallization structure.

FIG. 4 shows the 3-layer alloy structure of FIG. 2A in the context of a circuit. An adhesion/barrier layer 20 comprising, for example, titanium or titanium nitride (Ti/TiN), is deposited over the interlevel dielectric layer 10. Layers 30 and 50 are 4% Cu/Al alloy, while layer 40 is 1% Cu/Al alloy. Layer 60 of photoresist is shown prior to the beginning of the etch step.

Figure 6:
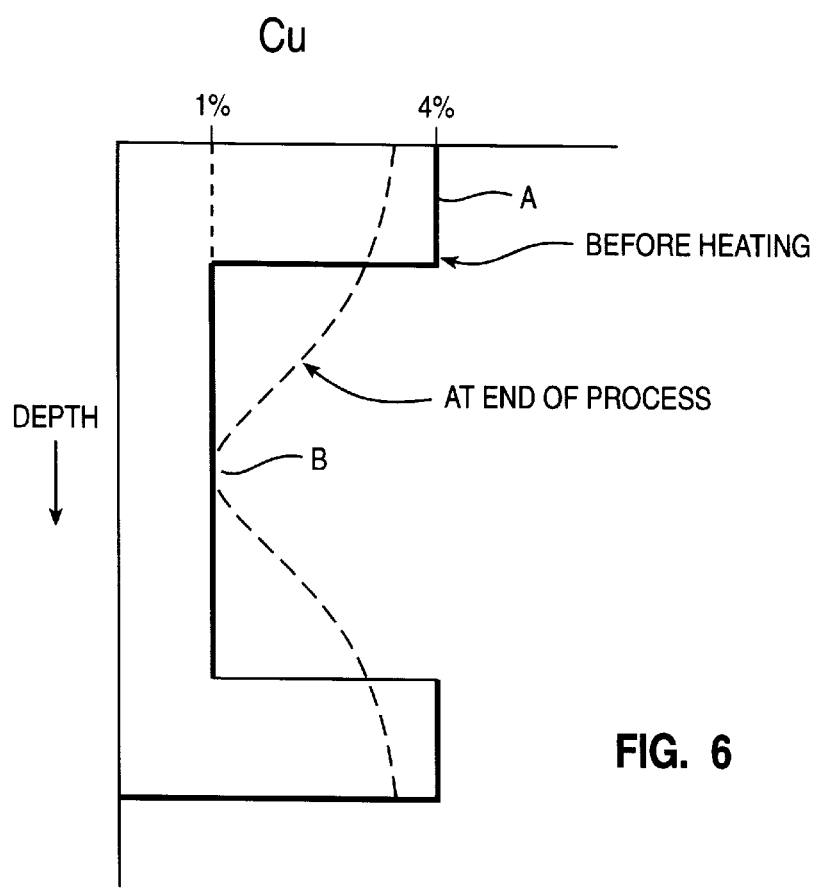
FIG. 6 shows an Al/Cu alloy distribution gradient after the alloying process.

FIG. 6 is a graph of the distribution of copper in the aluminum alloy both before and after further thermal processing. Before the heat cycle begins, the copper concentrations are as deposited, as shown by solid line A. When heating begins, the diffusion process gradually redistributes the concentration to a more homogeneous dispersion, as shown by dotted line B. This distribution will of course, continue to change over time and the redistribution can be taken to a point of greater or lesser homogeneity, as desired.

Second Embodiment: Al/Cu Alloys in 1/4/1% Layers

Figure 2B:
FIG. 2B shows a thin high-copper aluminum alloy layer sandwiched between thick, low-copper aluminum alloy layers.

FIG. 2B shows a thin, 4% Cu/Al alloy layer sandwiched between 1% Cu/Al alloy layers. This profile means that only one short, high-bias-power etch step (in addition to the regular etch) is necessary to etch the metal layer. Subsequent thermal cycling and/or final sinter can diffuse the copper and form a more homogenous film.

Third Embodiment: Two layer Al/Cu Alloys

Figure 3:
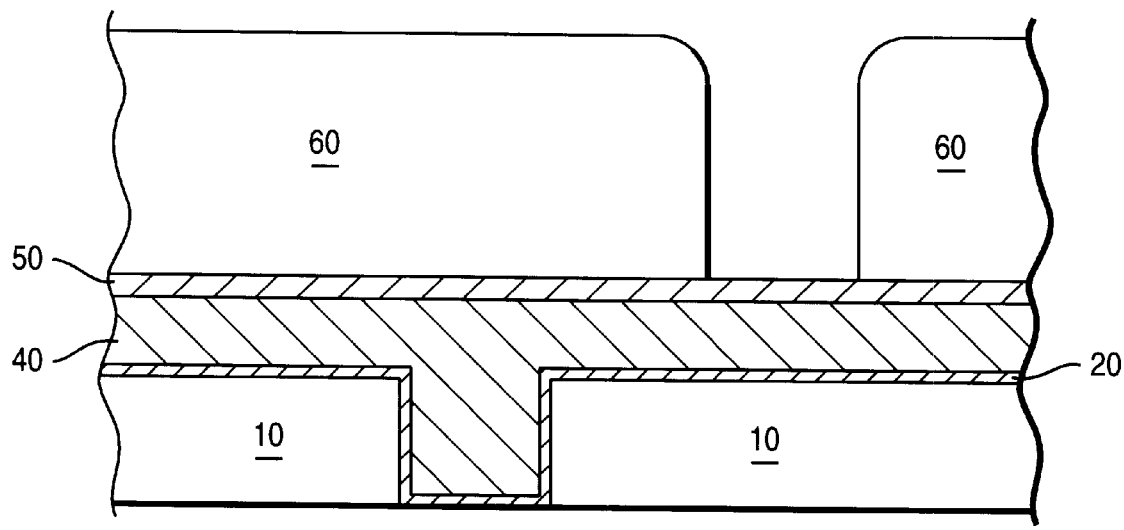
FIG. 3 shows a 2-layer Al/Cu alloy metallization structure.

FIG. 3 shows a 2-layer AlCu alloy metallization structure. An adhesion/barrier layer 20 comprising, for example, TiN/Ti, is deposited over interlevel dielectric layer 10. A two-layer embodiment of the innovative alloy is deposited upon the structure followed by a patterned etch of the photoresist. The two-layer embodiment comprises, in this example, a thicker first layer of 1% Cu/Al 40, followed by a second layer 50 of 4% Cu/Al.

Fourth Embodiment: Al/Cu/Si

In an alternative embodiment this technique may be applied to other alloys of aluminum and copper. For example, the top and bottom layers may comprise an alloy of aluminum with copper and silicon. The presence of silicon is desirable to reduce "spiking", but can increase susceptibility to electromigration, while the present disclosure provides a way to lessen this effect.

Fifth Embodiment: Pure Metal Layers

In an alternative embodiment the thin layer(s) can consist of a pure metal which is normally alloyed with aluminum. For example, a thick layer of aluminum can be overlain by a thin layer of copper, which is later thermally treated to provide a high-copper alloy at the surface.

Sixth Embodiment: Graded Ti Composition

In an alternative embodiment, the alloy layers may contain varying concentrations of titanium alloyed with aluminum.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should also be noted that the number of layers of metallization described above does not implicitly limit any of the claims, which can be applied to processes and structures with more or fewer layers.

Similarly, it will be readily recognized that the described process steps can also be embedded into hybrid process flows, such as BiCMOS or smart-power processes.

It will also be recognized that this technique may be applied to alternative alloying agents, or with other (non-aluminum-based) metal and alloy systems.

It will also be recognized that this technique may use other adhesion/barrier layers between the bottom metallization layer and the dielectric.

What is claimed is:

1. A integrated circuit metallization method, comprising the steps of:
    (a.) depositing, over a dielectric, a first metallization layer comprising both a primary metal component and a first concentration of an alloying component, wherein said alloying component is difficult to etch under dry etching conditions which etch said primary metal component;
    (b.) depositing, on said first metallization layer, a second metallization layer comprising said primary metal component and a second concentration of said alloying component, wherein a thicker one of said first and second metallization layers has a lower concentration of said alloying component than a thinner one;
    (c.) after step (b.), forming a patterned masking layer over said second layer;
    (d.) after step (c.), etching said second layer, with a first etch protocol, where exposed by said masking layer; and
    (e.) after step (d.), etching said first layer, with a second etch protocol which is different from said first etch protocol;
    wherein said first metallization layer comprises aluminum with 1% copper and said second metallization layer comprises aluminum with 4% copper.

2. The metallization method of claim 1, further comprising:
    (f.) after step (e.), thermal cycling said first and second metallization layers so that the homogeneity between said first and second metallization layers is increased.

3. The metallization method of claim 1, wherein said primary metal component comprises aluminum and said alloying component comprises copper.

4. The metallization method of claim 1, wherein said first etch protocol comprises a high-bias-power etch.

5. A integrated circuit metallization method, comprising the steps of:
    (a.) depositing a bottom aluminum-copper alloy layer over a dielectric;
    (b.) depositing a middle aluminum-copper alloy layer on said bottom alloy layer;
    (c.) depositing a top aluminum-copper alloy layer on said middle alloy layer;
    wherein said bottom and top layers have a higher copper content than said middle layer, and said bottom and top layers are thinner than said middle layer.

6. The metallization method of claim 5, further comprising:
    (d.) after step (c.), thermal cycling said alloy layers so that the homogeneity between said alloy layers is increased.

7. The metallization method of claim 5, wherein said middle layer has a copper content of 1%.

8. The metallization method of claim 5, wherein said top and bottom layers have a copper content of 4%.

9. A integrated circuit metallization method, comprising the steps of:
    (a.) depositing a bottom aluminum-copper alloy layer over a dielectric;
    (b.) depositing a middle aluminum-copper alloy layer on said bottom alloy layer;
    (c.) depositing a top aluminum-copper alloy layer on said middle alloy layer;
    wherein said middle layer has a higher copper content than said bottom and top layers, and said middle layer is thinner than said bottom and top layers.

10. The metallization method of claim 9, further comprising:
    (d.) after step (c.), thermal cycling said alloy layers so that the homogeneity between said alloy layers is increased.

11. The metallization method of claim 9, wherein said middle layer has a copper content of 4%.

12. The metallization method of claim 9, wherein said top and bottom layers have a copper content of 1%.

13. An integrated circuit metallization method, comprising the steps of:
    (a.) depositing, over a dielectric, a first metalization layer comprising both a primary metal component and a first concentration of an alloying component;
    (b.) depositing, on said first metallization layer, a second metallization layer comprising said primary metal component and a second concentration of said alloying component, wherein a thicker one of said first and second metallization layers has a lower concentration of said alloying component than a thinner one;
    (c.) depositing, on said second metallization layer, a third metallization layer comprising said primary metal component and said first concentration of the alloying component;
    (d.) after step (c.), forming a patterned masking layer over said third metallization layer;
    (e.) after step (d.), etching said third metallization layer, with a first etch protocol, where exposed by said masking layer;
    (f.) after step (e), etching said second metallization layer with a second etch protocol which is different from said first etch protocol; and
    (g.) after step (f.), etching said first metallization layer, with the first etch protocol.

* * * * *